(12) United States Patent
Lee et al.

(10) Patent No.: US 7,700,493 B2
(45) Date of Patent: Apr. 20, 2010

(54) METHOD FOR FABRICATING SEMICONDUCTOR DEVICE

(75) Inventors: Sung-Kwon Lee, Kyoungki-do (KR); Min-Suk Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 68 days.

(21) Appl. No.: 11/904,401

(22) Filed: Sep. 27, 2007

(65) Prior Publication Data
US 2008/0081446 A1   Apr. 3, 2008

(30) Foreign Application Priority Data
Sep. 29, 2006  (KR) .................. 10-2006-0096465

(51) Int. Cl.
*H01L 21/302* (2006.01)
(52) U.S. Cl. .................................... 438/706
(58) Field of Classification Search ............... None
See application file for complete search history.

(56) References Cited
U.S. PATENT DOCUMENTS

| | | | |
|---|---|---|---|
| 5,509,995 A | 4/1996 | Park | |
| 5,869,404 A | 2/1999 | Kim et al. | |
| 6,174,451 B1 | 1/2001 | Hung et al. | |
| 6,325,861 B1 * | 12/2001 | Stinnett | 134/2 |
| 6,569,778 B2 | 5/2003 | Lee et al. | |
| 2002/0173160 A1 * | 11/2002 | Keil et al. | 438/717 |
| 2006/0003571 A1 | 1/2006 | Lee et al. | |
| 2007/0020827 A1 * | 1/2007 | Buh et al. | 438/157 |

FOREIGN PATENT DOCUMENTS

| | | |
|---|---|---|
| CN | 1288253 | 3/2001 |
| JP | 4-258117 | 9/1992 |
| KR | 1020040057748 A | 7/2004 |

* cited by examiner

*Primary Examiner*—Charles D Garber
*Assistant Examiner*—Andre' C Stevenson
(74) *Attorney, Agent, or Firm*—Blakely, Sokoloff, Taylor & Zafman

(57) ABSTRACT

A method for fabricating a semiconductor device includes forming a first pattern over a substrate, forming an oxide-based layer over the first pattern, forming a hard mask layer over the oxide-based layer, etching the hard mask layer at a first substrate temperature, and etching the oxide-based layer to form a second pattern, wherein the oxide-based layer is etched at a second substrate temperature which is greater than the first substrate temperature using a gas including fluorine (F) and carbon (C) as a main etch gas.

22 Claims, 3 Drawing Sheets

METHOD FOR FABRICATING SEMICONDUCTOR DEVICE

CROSS-REFERENCE TO RELATED APPLICATIONS

The present invention claims priority of Korean patent application number 10-2006-0096465, filed on Sep. 29, 2006, which is incorporated by reference in its entirety.

BACKGROUND OF THE INVENTION

The present invention relates to a method for fabricating a semiconductor device, and more particularly, to a method for fabricating a semiconductor device including a landing plug.

When performing a photolithography process using argon fluoride (ArF) having a wavelength of 193 nm in a semiconductor device having a line width of 80 nm or less, an additional condition has been generally required along with the typical etch process concepts, i.e., precise pattern formation and perpendicular etch profile. The condition refers to restraining deformation of photoresist which may be generated during etching. Thus, it has become important to develop an improved process condition which can satisfy typical conditions and the additional condition for restraining pattern deformation when fabricating a semiconductor of 80 nm or less. Meanwhile, various elements configuring a semiconductor device are formed into stack structures as the scale of integration accelerated. Thus, a contact plug (or a pad) is introduced. A landing plug contact technology using a self-aligned contact (SAC) method has been typically used when forming such contact plug. The landing plug contact technology is used to enlarge a contact surface area using a minimum surface area in a bottom portion, and to enlarge a process margin with respect to a subsequent process in an upper portion.

FIG. 1 illustrates a cross-sectional view of a typical method for fabricating a semiconductor device. Gate patterns G are formed over a substrate 11. Each gate pattern includes a stack structure configured with a gate insulation layer 12, a gate conductive layer 13 and a gate hard mask 14. An etch stop layer (not shown) is formed over the surface profile of the gate patterns G. An insulation layer is formed over the resultant structure. The insulation layer is planarized until the gate hard masks 14 are exposed. A photoresist pattern 17 is formed over a certain region of the planarized insulation layer. An anti-reflective coating layer 16 is formed between the photoresist pattern 17 and the planarized insulation layer. The planarized insulation layer is etched using the photoresist pattern 17 as an etch barrier to form contact holes 18 exposing the substrate 11 between adjacent gate patterns G. The process for forming the contact holes 18 is referred to as a self-aligned contact (SAC) etch process. Reference numeral 15 refers to a patterned insulation layer 15.

In the aforementioned typical method, the etch process for forming the contact holes 18 uses a gas including a $C_xF_y$ gas comprising fluorine (F) and carbon (C), where x and y representing atomic ratios of C and F, respectively, range from approximately 1 to approximately 10, and a $C_aH_bF_c$ gas comprising C, hydrogen (H) and F, where a, b, and c representing atomic ratios of C, H, and F, respectively, range from approximately 1 to approximately 10. For example, the $C_aH_bF_c$ gas includes $CH_2F_2$.

However, a vertical height of gate patterns increases as the scale of integration increases. Thus, it may be inevitable to overly use an etch gas or increase an etch time during the SAC etch for an amount corresponding to the increased etch target. Consequently, etch losses 'A' may be generated in the gate hard masks 14, causing a decreased shoulder margin and inducing a contact hole not-open event 'B'.

Prior arts for improving the aforementioned limitations are revealed in U.S. Pat. No. 6,174,451B1, U.S. Pat. No. 5,869,404B1, and U.S. Pat. No. 6,569,778B2, and U.S. Published Patent Application No. US20060003571 A1. However, it may be difficult to control complicated etch variables of the etch process in these prior arts because a $C_aH_bF_c$ gas or $C_xF_y$ gas is added during the etch process.

SUMMARY OF THE INVENTION

Embodiments of the present invention are directed to provide a method for fabricating a semiconductor device, which can improve a contact not-open event of a contact hole while minimizing loss of a gate hard mask.

In accordance with an aspect of the present invention, there is provided a method for fabricating a semiconductor device, including: forming a first pattern over a substrate; forming an oxide-based layer over the first pattern; forming a hard mask layer over the oxide-based layer; etching the hard mask layer at a first substrate temperature; and etching the oxide-based layer to form a second pattern, wherein the oxide-based layer is etched at a second substrate temperature which is greater than the first substrate temperature using a gas including fluorine (F) and carbon (C) as a main etch gas.

In accordance with another aspect of the present invention, there is provided a method for fabricating a semiconductor device, including: forming a plurality of gate patterns over a substrate, each gate pattern including a stack structure configured with a conductive layer and a nitride-based layer; forming an oxide-based layer for insulation over the gate patterns; forming a hard mask layer over the oxide-based layer; etching the hard mask layer at a first substrate temperature using a photoresist pattern; and performing a self-aligned contact etch process to etch the oxide-based layer at a second substrate temperature using a selectivity between the oxide-based layer and the nitride-based layer to form contact holes, wherein the oxide-based layer is etched using a gas including fluorine (F) and carbon (C) as a main etch gas.

In accordance with still another aspect of the present invention, there is provided a method for fabricating a semiconductor device, including: forming an etch stop layer and an insulation layer over a substrate; forming a hard mask layer over the insulation layer; etching the hard mask layer at a first substrate temperature; and etching the insulation layer and the etch stop layer to form contact holes exposing the substrate using a gas including a CxFy-based gas as a main etch gas at a second substrate temperature which is higher than the first substrate temperature, wherein the CxFy-based gas has a carbon to fluorine ratio of approximately 1.5:1 to 1.6:1.

DESCRIPTION OF SPECIFIC EMBODIMENTS

Embodiments of the present invention relate to a method for fabricating a semiconductor device.

FIGS. 2A to 2D illustrate cross-sectional views of a method for fabricating a semiconductor device in accordance with an embodiment of the present invention.

Figure 1:
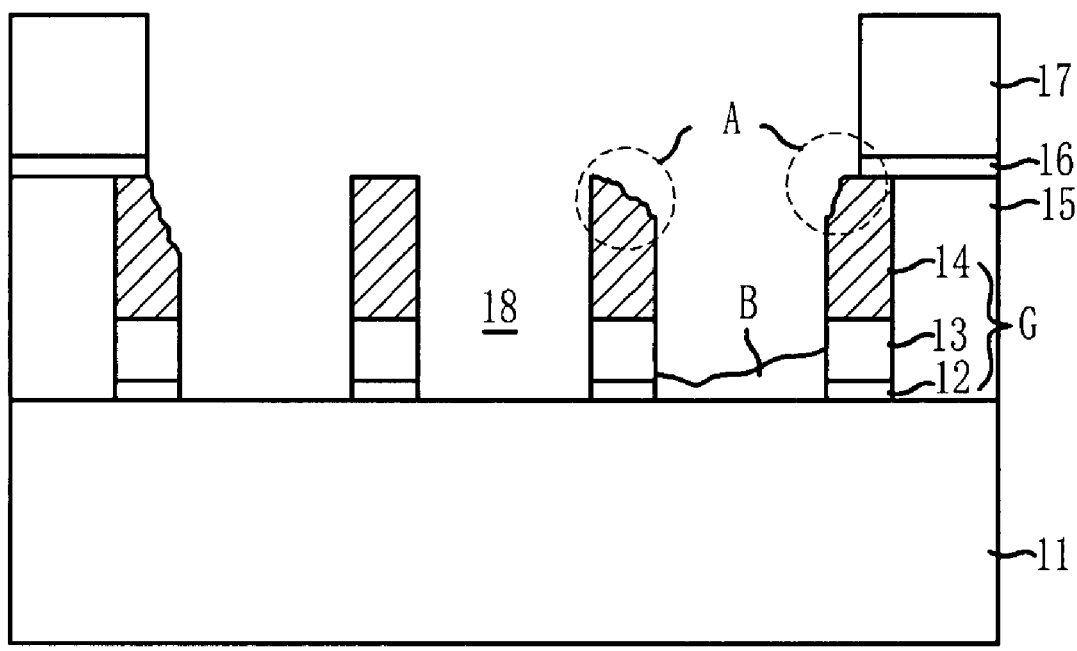
FIG. 1 illustrates a cross-sectional view of a typical method for fabricating a semiconductor device.
Figure 2A:
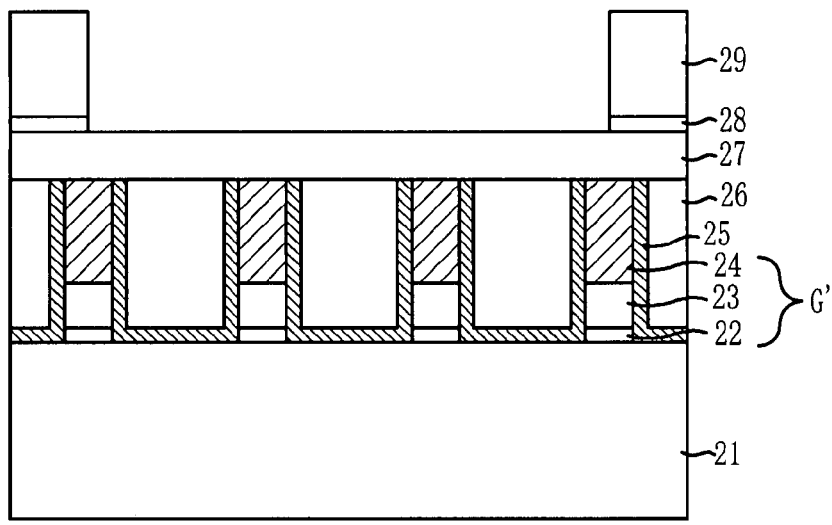
FIGS. 2A to 2D illustrate cross-sectional views of a method for fabricating a semiconductor device in accordance with an embodiment of the present invention.

Referring to FIG. 2A, gate patterns G' are formed over a semi-finished substrate 21 on which a well process and an isolation process are performed in advance. The gate patterns G' include a patterned gate insulation layer 22, a patterned gate conductive layer 23, and a patterned gate hard mask 24. In more detail, a gate insulation layer, a gate conductive layer, and a gate hard mask are formed over the substrate 21. A photo mask process is performed to form a patterned photoresist. The gate hard mask is etched using the patterned photoresist as a barrier. Thus, the patterned gate hard mask 24 is formed. The patterned photoresist is removed. The gate conductive layer and the gate insulation layer are etched using the patterned gate hard mask 24. Thus, the patterned gate insulation layer 22 and the patterned gate conductive layer 23 are formed.

The gate insulation layer is formed using a typical thermal oxidation and dry/wet oxidation. The gate conductive layer includes one of a polysilicon layer, a tungsten layer, a tungsten silicide layer and a combination thereof. The patterned gate hard mask 24 includes a nitride-based layer. For instance, the patterned gate hard mask 24 includes a silicon nitride layer.

An etch stop layer is formed over the surface profile of the gate patterns G'. The etch stop layer includes a nitride-based layer. For instance, the etch stop layer includes a silicon nitride layer.

An insulation layer is formed over the resultant structure. A chemical mechanical polishing (CMP) process or an etch-back process is performed to planarize the insulation layer until the patterned gate hard mask 24 is exposed. At this time, portions of the etch stop layer over upper surfaces of the gate patterns G' are also polished. Thus, a patterned etch stop layer 25 and a polished insulation layer 26 are formed.

The polished insulation layer 26 includes one selected from a group consisting of a borosilicate glass (BSG) layer, a phosphosilicate glass (PSG) layer, a tetraethyl orthosilicate (TEOS) layer, a high density plasma (HDP) oxide layer, a spin on glass (SOG) layer, and an advanced planarization layer (APL). Also, the polished insulation layer 26 may include an inorganic- or organic-based low-k dielectric layer, other than an oxide-based layer.

A hard mask layer 27 is formed over the polished insulation layer 26. The hard mask layer 27 will be used as a contact hard mask during a contact etching. The hard mask layer 27 includes one selected from a group consisting of a silicon oxynitride (SiON) layer, an amorphous carbon layer, a polysilicon layer, an organic polymer layer, an inorganic polymer layer, a nitride-based layer, and a combination thereof.

A photoresist pattern 29 is formed over the hard mask layer 27. The photoresist pattern 29 may be formed in a line type or trench type structure. An anti-reflective coating layer 28 may be formed below the photoresist pattern 29.

Figure 2B:
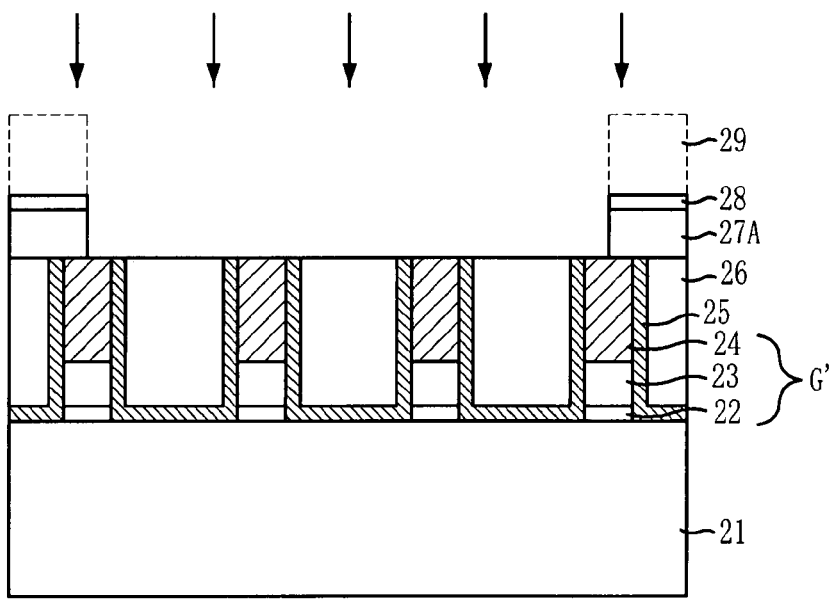

Referring to FIG. 2B, the hard mask layer 27 is etched using the photoresist pattern 29 as an etch barrier to form a hard mask pattern 27A. The hard mask layer 27 is etched at a first substrate temperature ranging from approximately −60° C. to approximately 20° C. Etching the hard mask layer 27 at the first substrate temperature controls physical and chemical reactions depending on the temperature, and allows forming the hard mask pattern 27A without deformation. The photoresist pattern 29 may be removed after the hard mask pattern 27A is formed.

Figure 2C:
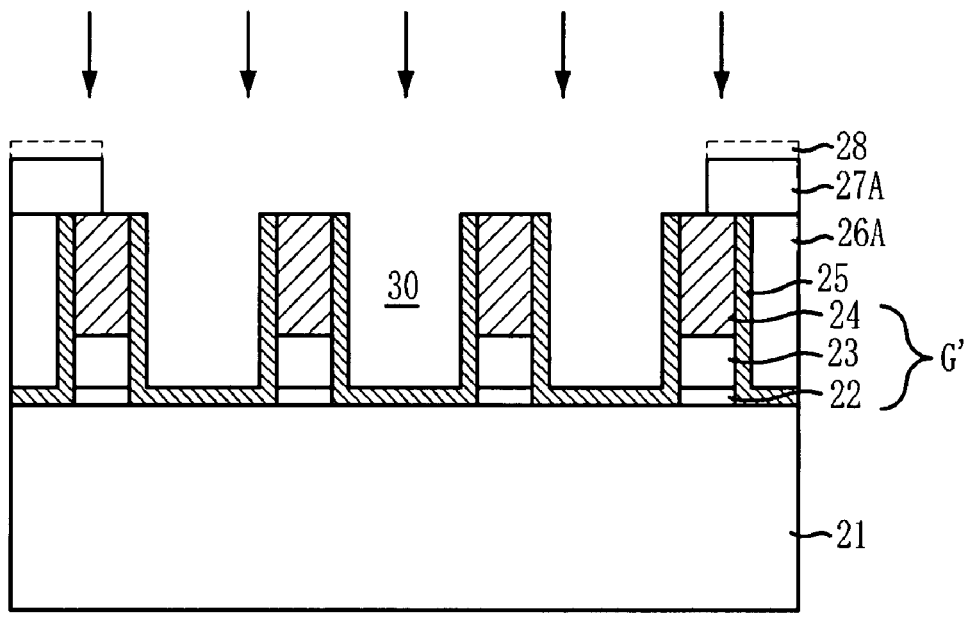

Referring to FIG. 2C, the polished insulation layer 26 and the patterned etch stop layer 25 are etched using the anti-reflective coating layer 28 as an etch barrier to form contact holes 30 exposing the substrate 21 between the gate patterns G'. Thus, a remaining insulation layer 26A is formed. The anti-reflective coating layer 28 may be etched while etching the polished insulation layer 26. The polished insulation layer 26 may be etched in substantially the same etch apparatus as the one used for etching the hard mask layer 27 or in a separate etch apparatus, using a gas including carbon (C) and fluorine (F), i.e., a $C_xF_y$-based gas, as a main etch gas. The polished insulation layer 26 is etched at a second substrate temperature which is higher than the first substrate temperature used for etching the hard mask layer 27. For instance, the second substrate temperature ranges from approximately 30° C. to approximately 60° C.

The $C_xF_y$-based gas used as the main etch gas includes a gas having a low carbon to fluorine ratio such as $C_4F_6$ or $C_5F_8$ gas. Oxygen ($O_2$) and argon (Ar) may be added to the main etch gas as a subsidiary gas. A flow rate of the $C_xF_y$-based gas used as the main etch gas and $O_2$ may range from approximately 0.5 sccm to approximately 1.3 sccm. For instance, a flow rate of $C_4F_6$ gas and $O_2$ may range from approximately 0.5 sccm to approximately 1.3 sccm.

When the polished insulation layer 26 is etched using the $C_xF_y$-based gas as a main etch gas, a high selectivity between oxide, i.e., the polished insulation layer 26, and nitride, i.e., the patterned gate hard mask 24, may be secured. Thus, a loss of the patterned gate hard mask 24 is minimized and opening of the contact holes 30 may be significantly improved.

In other words, using a $C_xF_y$-based gas having a low carbon to fluorine ratio as a main etch gas to form a contact hole allows obtaining a high selectivity to nitride, protecting nitride-based materials while selectively etching oxide-based materials. Thus, undesirable formation of the contact hole may be reduced while a loss of the nitride-based materials is decreased. Consequently, etch losses of the patterned gate hard mask 24 and the patterned etch stop layer 25 are reduced while etching the polished insulation layer 26 including oxide.

The high selectivity to nitride may be obtained because the main etch gas includes the $C_xF_y$-based gas. In particular, the $C_xF_y$-based gas includes a gas having a low carbon to fluorine ratio, i.e., y/x ratio, such as $C_4F_6$ gas, where the y/x ratio is approximately 1.5:1, or $C_5F_8$ gas, where the y/x ratio is approximately 1.6:1. A gas having a low carbon to fluorine ratio allows easier generation of $CF_2$ radicals than a gas having a high carbon to fluorine ratio. The $CF_2$ radicals etch oxide with a high selectivity to nitride. For instance, the $C_xF_y$-based gas according to this embodiment includes a gas having a carbon to fluorine ratio of 1.6:1 or less. Thus, the high selectivity to nitride may be obtained without generating polymers while etching oxide.

A higher selectivity to nitride may be obtained if the polished insulation layer 26 is etched at a substrate temperature ranging from approximately 30° C. to approximately 60° C., i.e., the second substrate temperature. That is, using the main etch gas including a gas having a low carbon to fluorine ratio, i.e., y/x ratio, such as $C_4F_6$ gas, where the y/x ratio is approximately 1.5:1, or $C_5F_8$ gas, where the y/x ratio is approximately 1.6:1, at the second substrate temperature ranging from approximately 30° C. to approximately 60° C., makes it easier to obtain the high selectivity to nitride.

Figure 2D:
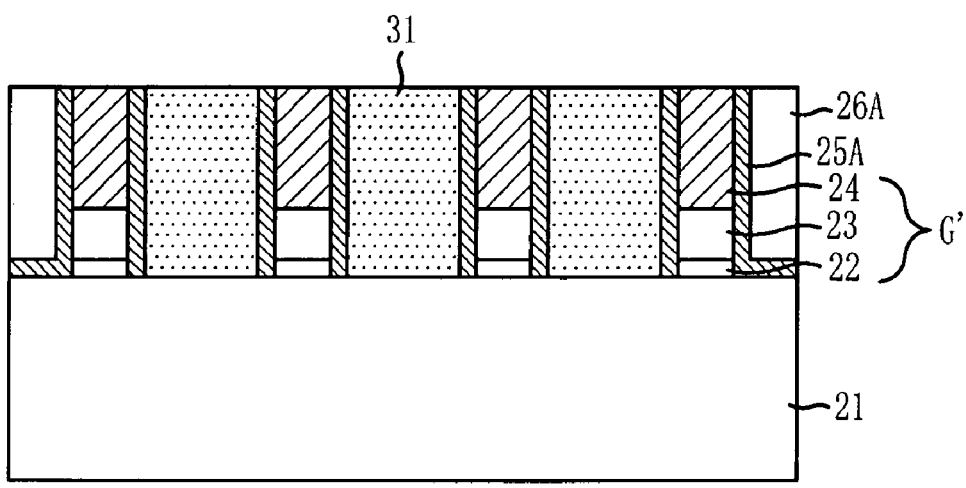

Referring to FIG. 2D, the patterned etch stop layer 25 is etched and the hard mask pattern 27A is removed. Thus, a remaining etch stop layer 25A is formed. A conductive material for forming a plug is formed over the resultant substrate structure. For instance, the conductive material includes a polysilicon layer. The conductive material is planarized until the patterned gate hard mask 24 is exposed to form landing plugs 31 between adjacent gate patterns G'.

According to the embodiment of the present invention, the hard mask layer used as a self-aligned contact (SAC) hard mask is etched at the low substrate temperature and the patterned insulation layer is etched at a substrate temperature ranging from approximately 30° C. to approximately 60° C. using the $C_xF_y$-based gas and a subsidiary gas including $O_2$ and Ar. Consequently, a high selectivity margin may be obtained between oxide and nitride, resulting in a minimized loss of the patterned gate hard mask while improving the opening forms.

That is, undesirable not-open events of the contact holes may be improved while securing a shoulder margin of the patterned gate hard mask without using a CHF-based etch gas which is often used during a typical SAC process for generating polymers. Complicated etch variables may not need to be controlled during the etch process because the CHF-based gas is not used.

Although this embodiment of the present invention describes forming the contact holes between the gate patterns, this invention may also be applied to forming contact holes between bit line patterns or metal line patterns.

In accordance with the embodiment of the present invention, a shoulder margin of the gate hard mask may be maintained because the loss of the gate hard mask is reduced while not using the CHF-based gas which is a polymer-generating gas often used in the typical SAC etch process. Furthermore, maintaining the shoulder margin of the gate hard mask improves the not-open events of the contact holes.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a first pattern over a substrate;
   forming an oxide-based layer over the first pattern;
   forming a hard mask layer over the oxide-based layer;
   etching the hard mask layer at a first substrate temperature; and
   etching the oxide-based layer to form a second pattern,
   wherein the oxide-based layer is etched at a second substrate temperature which is greater than the first substrate temperature using a gas including fluorine (F) and carbon (C) as a main etch gas.

2. The method of claim 1, wherein the gas including F and C comprises a $C_xF_y$-based gas having a carbon to fluorine ratio (y/x ratio) of approximately 1.6:1 or less, where x and y represent an atomic ratio of C and F, respectively.

3. The method of claim 2, wherein the $C_xF_y$-based gas includes one of $C_4F_6$ gas and $C_5F_8$ gas.

4. The method of claim 2, wherein oxygen ($O_2$) and argon (Ar) are added to the $C_xF_y$-based gas to etch the oxide-based layer.

5. The method of claim 4, wherein a flow rate of the $C_xF_y$-based gas and the $O_2$ ranges from approximately 0.5 sccm to approximately 1.3 sccm.

6. The method of claim 1, wherein the oxide-based layer is etched at a substrate temperature ranging from approximately 30° C. to approximately 60° C.

7. The method of claim 1, wherein performing the self-aligned contact etch process to etch the oxide-based layer comprises using a hard mask layer.

8. The method of claim 1, wherein the first pattern comprises one of a gate pattern, a bit line pattern, and a metal line, having the nitride-based layer in an upper portion, and the second pattern comprises a contact hole.

9. A method for fabricating a semiconductor device, comprising:
   forming a plurality of gate patterns over a substrate, each gate pattern including a stack structure configured with a conductive layer and a nitride-based layer;
   forming an oxide-based layer for insulation over the gate patterns;
   forming a hard mask layer over the oxide-based layer;
   etching the hard mask layer at a first substrate temperature using a photoresist pattern; and
   performing a self-aligned contact etch process to etch the oxide-based layer at a second substrate temperature using a selectivity between the oxide-based layer and the nitride-based layer to form contact holes,
   wherein the oxide-based layer is etched using a gas including fluorine (F) and carbon (C) as a main etch gas.

10. The method of claim 9, wherein the first substrate temperature ranges from approximately −60° C. to approximately 20° C., and the second substrate temperature is higher than the first substrate temperature.

11. The method of claim 9, wherein the second substrate temperature ranges from approximately 30° C. to approximately 60° C., and the first substrate temperature is lower than the second substrate temperature.

12. The method of claim 9, wherein the first substrate temperature ranges from approximately −60° C. to approximately 20° C., and the second substrate temperature ranges from approximately 30° C. to approximately 60° C.

13. The method of claim 9, wherein the gas including F and C comprises a $C_xF_y$-based gas having a carbon to fluorine ratio (y/x ratio) of approximately 1.6:1 or less, where x and y represent an atomic ratio of C and F, respectively.

14. The method of claim 13, wherein the $C_xF_y$-based gas includes one of $C_4F_6$ gas and $C_5F_8$ gas.

15. The method of claim 13, wherein oxygen ($O_2$) and argon (Ar) are added to the $C_xF_y$-based gas to etch the oxide-based layer.

16. The method of claim 15, wherein a flow rate of the $C_xF_y$-based gas and the $O_2$ ranges from approximately 0.5 sccm to approximately 1.3 sccm.

17. The method of claim 9, wherein the hard mask layer comprises one selected from a group consisting of a silicon oxynitride (SiON) layer, an amorphous carbon layer, a polysilicon layer, an organic polymer layer, an inorganic polymer layer, a nitride-based layer, and a combination thereof.

18. The method of claim 9, wherein performing the self-aligned contact etch process to etch the oxide-based layer comprises etching the oxide-based layer in substantially the same etch apparatus as the one used for etching the hard mask layer or in a separate etch apparatus.

19. A method for fabricating a semiconductor device, comprising:
   forming an etch stop layer and an insulation layer over a substrate;
   forming a hard mask layer over the insulation layer;
   etching the hard mask layer at a first substrate temperature; and
   etching the insulation layer and the etch stop layer to form contact holes exposing the substrate using a gas including a $C_xF_y$-based gas as a main etch gas at a second substrate temperature which is higher than the first substrate temperature,
   wherein the $C_xF_y$-based gas has a carbon to fluorine ratio of approximately 1.5:1 to 1.6:1.

20. The method of claim 19, wherein etching the hard mask layer uses a photoresist pattern to form a hard mask pattern.

21. The method of claim 20, wherein etching the insulation layer uses an anti-reflective coating layer as an etch barrier.

22. The method of claim 21, further comprising:
removing the hard mask pattern;
etching the remaining etch stop layer;
forming a plug over the resultant substrate structure using a conductive material; and
planarizing the conductive material until a gate hard mask is exposed to form landing plugs between adjacent gate patterns.

* * * * *